(12) United States Patent
Lin

(10) Patent No.: US 9,040,342 B2
(45) Date of Patent: May 26, 2015

(54) PHOTOVOLTAIC CELL AND MANUFACTURING METHOD THEREOF

(75) Inventor: Shiuan-Leh Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 166 days.

(21) Appl. No.: 13/606,406

(22) Filed: Sep. 7, 2012

(65) Prior Publication Data

US 2014/0069489 A1 Mar. 13, 2014

(51) Int. Cl.
*H01L 31/06* (2012.01)
*H01L 31/18* (2006.01)
*H01L 31/0693* (2012.01)

(52) U.S. Cl.
CPC ........ *H01L 31/1844* (2013.01); *H01L 31/0693* (2013.01); *Y02E 10/544* (2013.01)

(58) Field of Classification Search
CPC .................................................. H01L 31/06875
USPC ..................................... 136/255; 438/72, 724
See application file for complete search history.

(56) References Cited

U.S. PATENT DOCUMENTS

| 2004/0065363 | A1* | 4/2004 | Fetzer et al. | 136/262 |
| 2006/0162768 | A1* | 7/2006 | Wanlass et al. | 136/262 |
| 2007/0175507 | A1* | 8/2007 | Dutta | 136/255 |
| 2010/0096001 | A1* | 4/2010 | Sivananthan et al. | 136/249 |
| 2011/0287578 | A1* | 11/2011 | Wojtczuk et al. | 438/94 |
| 2012/0073638 | A1* | 3/2012 | Zhang et al. | 136/255 |

OTHER PUBLICATIONS

Cotal et al III-V multijunction solar cells for concentrating photovoltaics, Energy and Environmental Science, 2008, vol. 2, pp. 174-192.*
Wojtczuk et al, Bifacial Growth InGaP/GaAs/InGaAs Concentrator Solar Cells, Jul. 2012, IEEE Journal of Photovoltaics, vol. 2 No. 3, pp. 371-376.*

* cited by examiner

*Primary Examiner* — Jonathan Johnson
*Assistant Examiner* — Bethany L Martin
(74) *Attorney, Agent, or Firm* — Muncy, Geissler, Olds & Lowe, P.C.

(57) ABSTRACT

A photovoltaic cell comprises a top subcell having a first band gap; a middle subcell comprising a substrate and having a second band gap, wherein the substrate comprises a first side and a second side opposite to the first side; and a bottom subcell having a third band gap, wherein the top subcell is grown on the first side of the substrate and the bottom subcell is grown on the second side of the substrate, wherein the first band gap is larger than the second band gap and the second band gap is larger than the third band gap.

11 Claims, 7 Drawing Sheets

PHOTOVOLTAIC CELL AND MANUFACTURING METHOD THEREOF

TECHNICAL FIELD

The application relates to a photovoltaic cell, and more particularly, to a photovoltaic cell comprising a top subcell, a middle subcell comprising a substrate, and a bottom subcell, and the manufacturing method thereof.

DESCRIPTION OF BACKGROUND ART

Photovoltaic cells of III-V compound semiconductor materials have been provided in recent years. Compared to the silicon-based photovoltaic cell, the photovoltaic cells made of the III-V compound semiconductor have greater energy conversion efficiency and higher radiation resistance. The conversion efficiency of the III-V compound semiconductor photovoltaic cell is higher than that of the silicon-based photovoltaic cell because the III-V compound semiconductor photovoltaic cell splits the spectrum of the incident radiation by multiple subcells having different energy band gaps, and accumulates the photon induced current from each subcell.

FIGS. 1A-1D illustrate a manufacturing method of a conventional multi-junction photovoltaic cell 1. As shown in FIG. 1A, an InGaP-based subcell 12 having energy gap of 1.8 eV, a GaAs-based subcell 14 having energy gap of 1.4 eV and an InGaAs-based subcell 18 having energy gap of 0.8 eV are sequentially grown on a GaAs substrate 10. Because the InGaP-based subcell 12 is lattice matched to the GaAs substrate 10, the InGaP-based subcell 12 is grown on the GaAs substrate 10 first. The GaAs-based subcell 14 and the InGaAs-based subcell 18 are then sequentially grown on the InGaP-based subcell 12. The InGaAs-based subcell 18 is substantially lattice mismatched to the GaAs-based subcell 14 and the GaAs substrate 10. A buffer layer 16 made of III-V semiconductor material is formed between the GaAs-based subcell 14 and the InGaAs-based subcell 18. Thus, the InGaP-based subcell 12, the GaAs-based subcell 14 and the InGaAs-based subcell 18 are stacked on the GaAs substrate 10 in the order from the highest energy gap to the lowest energy gap.

As shown in FIG. 1B, a silicon substrate 11 is further formed on a side (not shown) of the InGaAs-based subcell 18 opposite to the GaAs substrate 10, and then the GaAs substrate 10 is removed. As shown in FIG. 1C, the InGaP-based subcell 12, the GaAs-based subcell 14, the InGaAs-based subcell 18 and the silicon substrate 11 are flipped such that the silicon substrate 11 is provided on a bottom side (not shown) of the photovoltaic cell 1. The InGaP-based subcell 12, the GaAs-based subcell 14 and the InGaAs-based subcell 18 are provided from the highest energy gap to the lowest energy gap to receiving the different regions of the solar spectrum. The InGaP-based subcell 12 having the highest energy gap is provided on a top side (not shown) of the photovoltaic cell 1 to be a top subcell of the photovoltaic cell 1 facing the solar radiation.

As shown in FIG. 1D, a top electrode 15 is formed on the InGaP-based subcell 12 and a bottom electrode 13 is formed on the silicon substrate 11. The top electrode 15 and the bottom electrode 13 collect the photon induced current generated from each subcell 12, 14 and 18.

SUMMARY OF THE APPLICATION

A manufacturing method of a photovoltaic cell comprises providing a middle subcell comprising a substrate and having a second band gap, wherein the substrate comprises a first side and a second side opposite to the first side; growing a top subcell having a first band gap on the first side of the substrate; and growing a bottom subcell having a third band gap on the second side of the substrate, wherein the first band gap is larger than the second band gap, and the second band gap is larger than the third band gap.

A photovoltaic cell comprises a top subcell having a first band gap; a middle subcell comprising a substrate and having a second band gap, wherein the substrate comprises a first side and a second side opposite to the first side; and a bottom subcell having a third band gap, wherein the top subcell is grown on the first side of the substrate and the bottom subcell is grown on the second side of the substrate, wherein the first band gap is larger than the second band gap, and the second band gap is larger than the third band gap.

DETAILED DESCRIPTION OF PREFERRED EMBODIMENTS

Figure 1A:
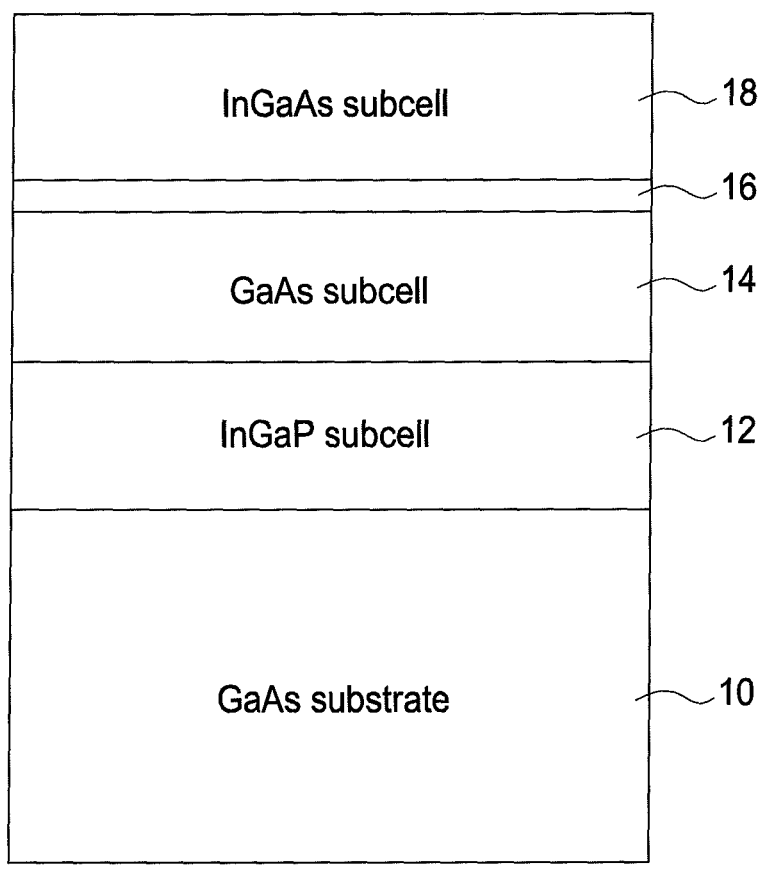
FIGS. 1A-1D illustrate a manufacturing method of a conventional multi-junction photovoltaic cell.
Figure 1B:
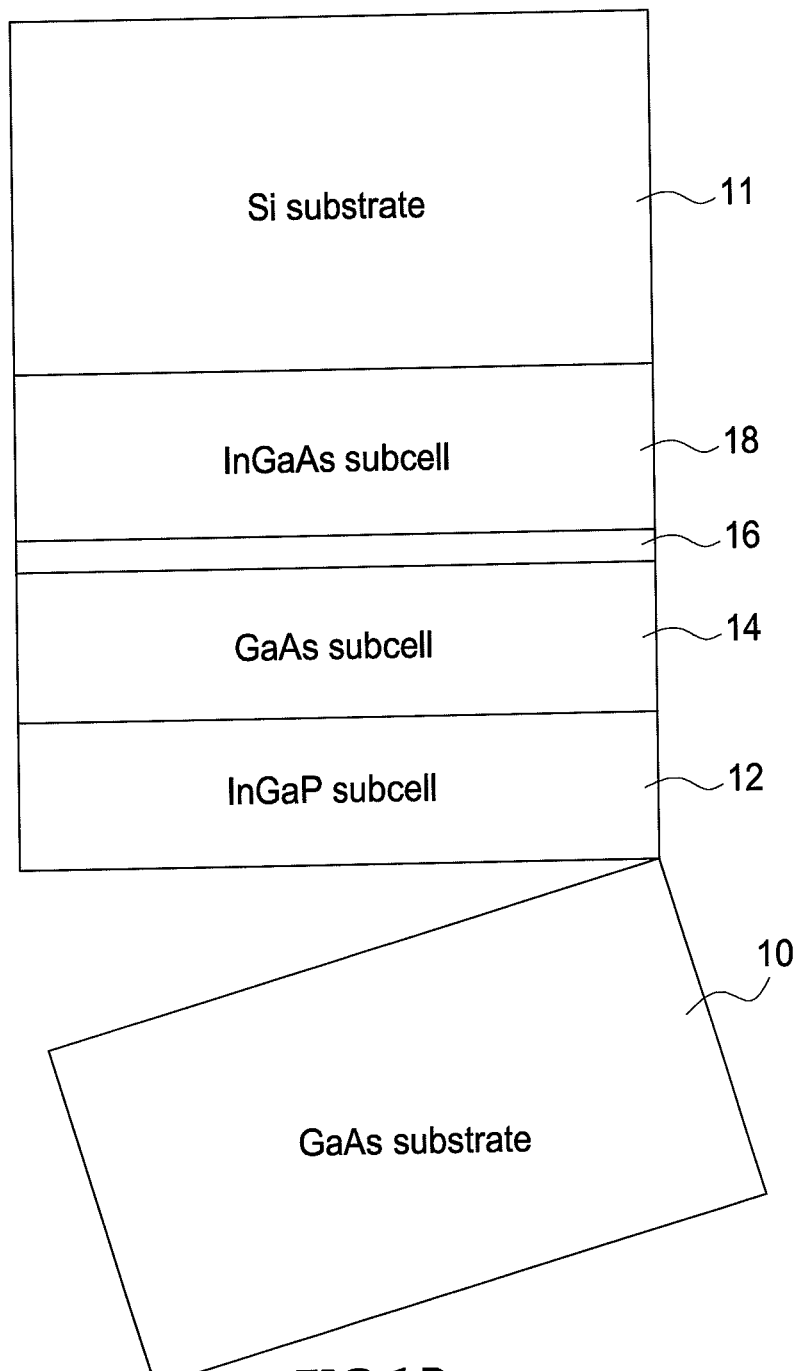
Figure 1C:
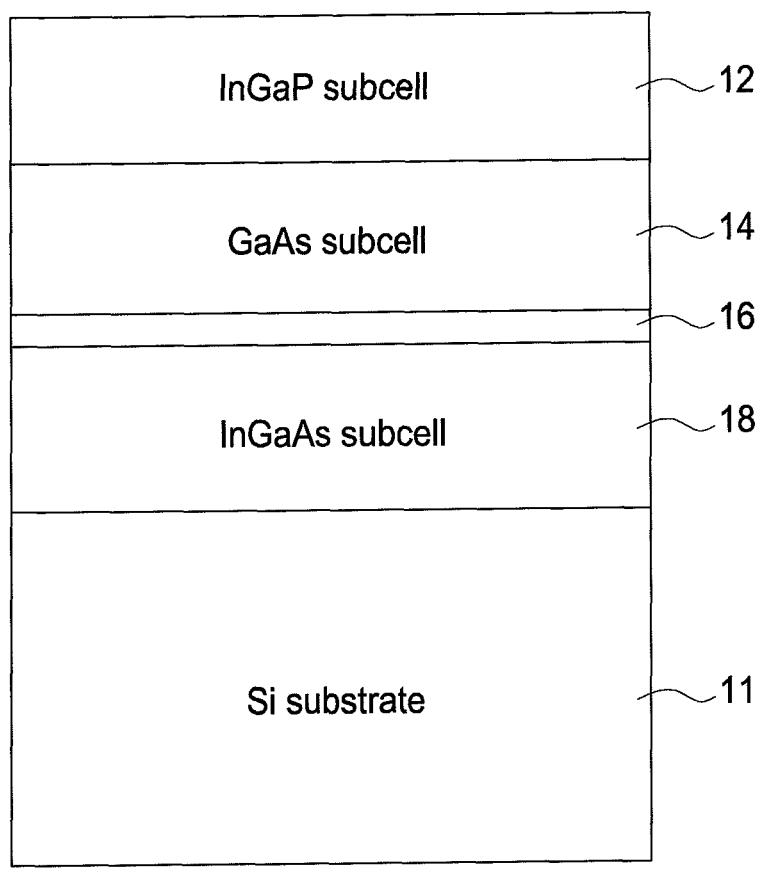
Figure 1D:
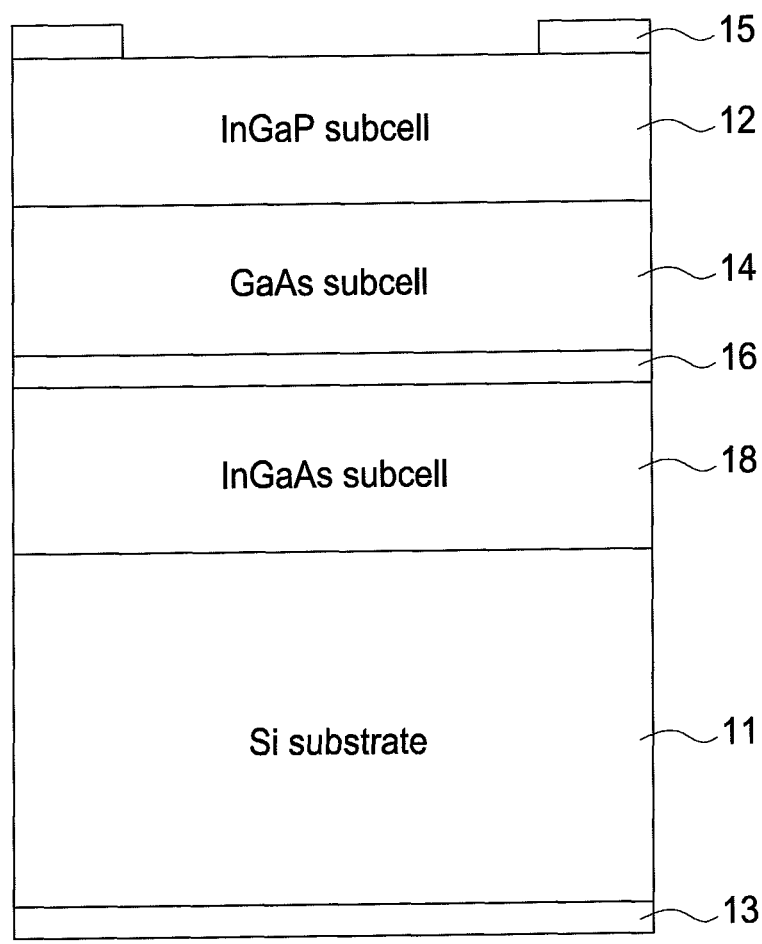

The embodiments of the application are illustrated in detail, and are plotted in the drawings. The same or the similar part is illustrated in the drawings and the specification with the same number.

Figure 2A:
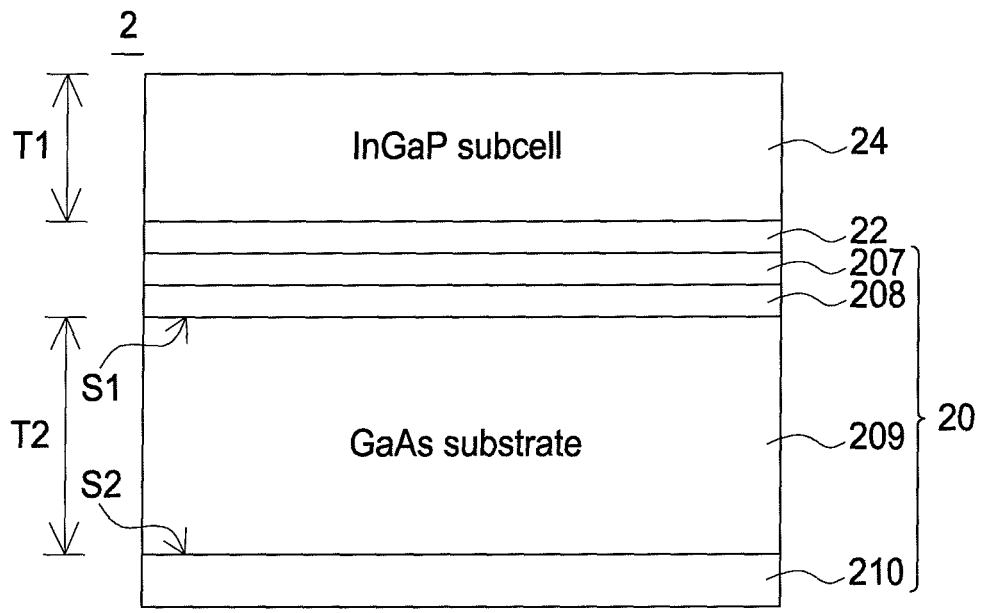
FIGS. 2A-2C illustrate a manufacturing method of a photovoltaic cell in accordance with an embodiment of the present application.
Figure 2B:
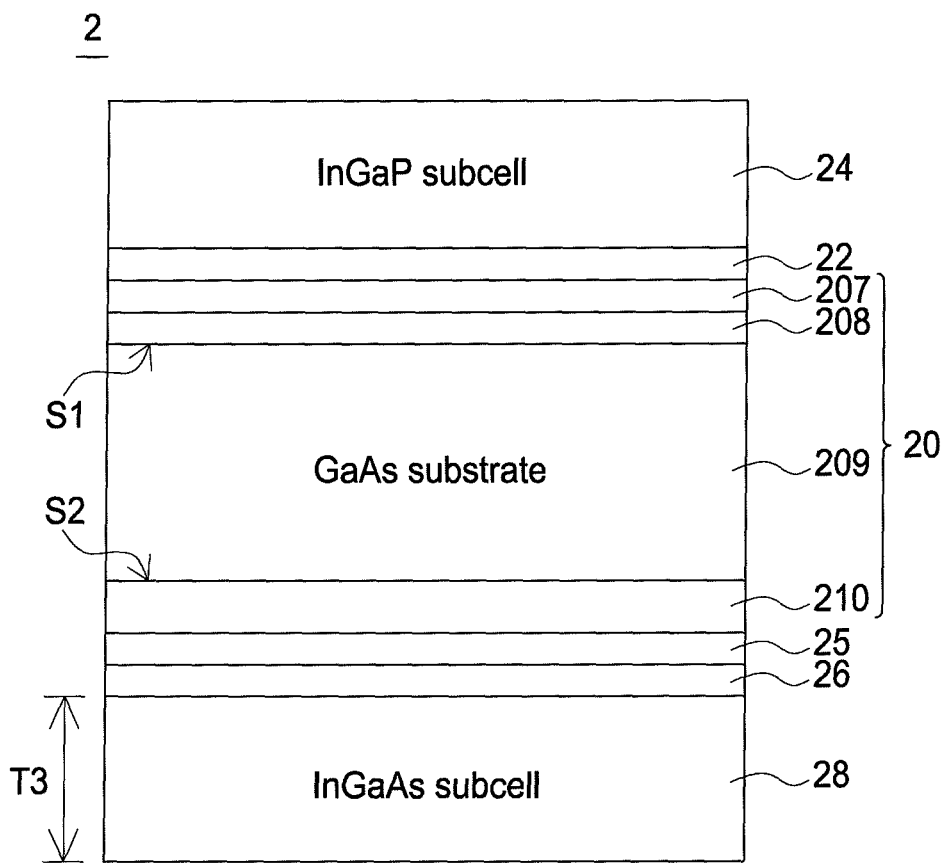
Figure 2C:
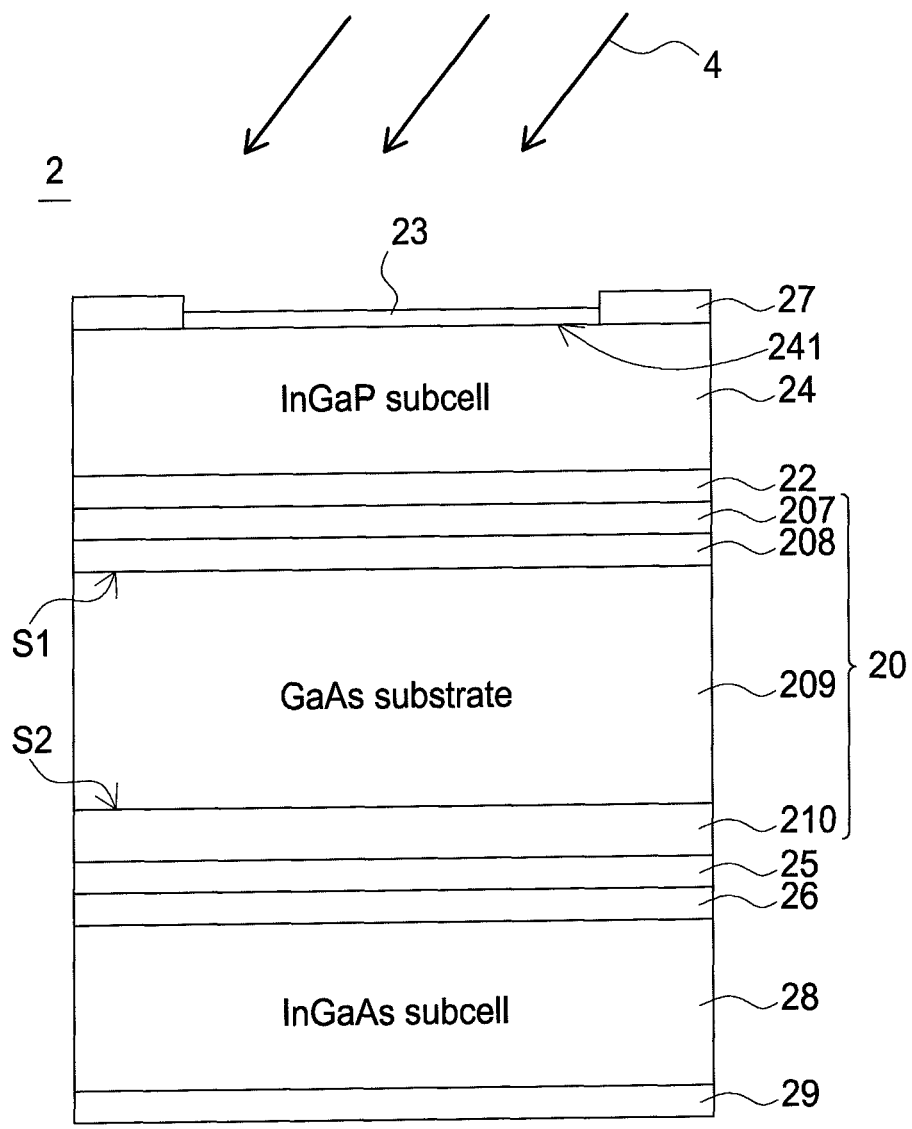

FIGS. 2A-2C illustrate a manufacturing method of a photovoltaic cell 2 in accordance with an embodiment of the present application. The manufacturing method comprises providing a middle subcell 20, wherein the middle subcell 20 comprises a substrate 209. The middle subcell 20 further comprises a window layer 207, an emitter layer 208 and a BSF layer 210 grown on the substrate 209. The middle subcell 20 has a second band gap. The substrate 209 comprises a first side S1 and a second side S2 opposite to the first side S1. The manufacturing method of the photovoltaic cell 2 further comprises growing a top subcell 24 having a first band gap on the first side S1 of the substrate 209 and growing a bottom subcell 28 having a third band gap on the second side S2 of the substrate 209, wherein the first band gap of the top subcell 24 is larger than the second band gap of the middle subcell 20, and the second band gap of the middle subcell 20 is larger than the third band gap of the bottom subcell 28.

As shown in FIG. 2A, the substrate 209 comprising III-V semiconductor material such as GaAs is provided to form the middle subcell 20, and the polarity of the substrate 209 is preferably p-type. The top subcell 24 comprising III-V semiconductor material such as InGaP is grown on the first side S1 of the substrate 209. In accordance with an embodiment of the present application, the thickness T2 of the substrate 209 is at least 100 μm, and the thickness T1 of the top subcell 24 is smaller than 10 μm. A tunnel junction 22 having $p^{++}/n^{++}$ doping and comprising III-V semiconductor material is formed between the middle subcell 20 and the top subcell 24 for electrical connection between the middle subcell 20 and the top subcell 24. Besides a metal organic chemical vapor deposition method (MOCVD method), the top subcell 24 may be formed on the substrate 209 by a known method such as a molecular beam epitaxy method (MBE method), a hydride vapor phase epitaxy method (HVPE method), a sputtering method, an ion-plating method, or an electron showering method.

As shown in FIG. 2B, the bottom subcell 28 comprising III-V semiconductor material such as InGaAs is grown on the second side S2 of the substrate 209. In accordance with an embodiment of the present application, the thickness T3 of the bottom subcell 28 is smaller than 10 μm. A tunnel junction 25 having $p^{++}/n^{++}$ doping and comprising III-V semiconductor material is formed between the middle subcell 20 and the bottom subcell 28 for electrical connection between the middle subcell 20 and the bottom subcell 28. Besides a metal organic chemical vapor deposition method (MOCVD method), the bottom subcell 28 may be formed on the substrate 209 by a known method such as a molecular beam epitaxy method (MBE method), a hydride vapor phase epitaxy method (HVPE method), a sputtering method, an ion-plating method, or an electron showering method.

In accordance with an embodiment of the present application, the bottom subcell 28 can be InGaAs-based subcell and the substrate 209 can be GaAs substrate. Because the difference of the lattice constant between InGaAs and GaAs is larger than 0.5%, a metamorphic buffer layer 26 comprising III-V semiconductor material is preferably formed between the bottom subcell 28 and the substrate 209 to reduce the epitaxial defect caused by the lattice mismatched.

In accordance with an embodiment of the present application, an emitter layer and/or a window layer made of GaAs-based material can be formed on the substrate 209 to form the middle subcell 20, and the forming temperature can be between 500° C. and 720° C., preferably between 600° C. and 620° C. The top subcell 24 made of InGaP-based material can be formed on the first side S1 of the substrate 209 and the forming temperature can be between 550° C. and 780° C., preferably between 650° C. and 680° C. The bottom subcell 28 made of InGaAs-based material can be formed on the second side S2 of the substrate 209 and the forming temperature can be between 550° C. and 780° C., preferably between 650° C. and 680° C.

In accordance with an embodiment of the present application, a first subcell having a higher band gap is provided on a side of a photovoltaic cell close to the sun than a second subcell having a lower band gap. The short wavelength energy of the solar spectrum is absorbed by the first subcell having higher band gap, and the longer wavelength energy of the solar spectrum is absorbed by the second subcell which has lower band gap and is provided below the first subcell having higher band gap. The middle subcell 20 has a second band gap between 0.9 eV and 1.8 eV, preferably between 1.2 eV and 1.5 eV. The top subcell 24 having a first band gap is formed on the first side S1 of the substrate 209 facing the solar radiation. In accordance with an embodiment of the present application, the first band gap is between 1.3 eV and 2.1 eV, preferably between 1.5 eV and 1.9 eV. The bottom subcell 28 having a third band gap is formed on the second side S2 of the substrate 209. In accordance with an embodiment of the present application, the third band gap is between 0.3 eV and 1.5 eV, preferably between 0.5 eV and 1.2 eV.

As shown in FIG. 2C, an anti-reflective layer 23 can be formed on a top surface 241 of the top subcell 24. The material of the anti-reflective layer 23 comprises oxide such as $TiO_2$, $Ta_2O_5$, $SiO_2$, nitride such as $Si_3N_4$, $SiO_xN_y$, and fluoride such as $MgF_2$, and the combination thereof. The anti-reflective layer 23 can be a single layer or a multi-layer structure, and is formed to reduce the surface reflection and increase the amount of the incident photon from the solar radiation.

In accordance with an embodiment of the present application, a top electrode 27 can be formed on the top subcell 24 and a bottom electrode 29 can be formed on the bottom subcell 28 for conducting electricity generated by the photovoltaic cell 2 in response to an incident light 4.

In accordance with another embodiment of the present application, a first plurality of subcells (not shown) can be grown between the top subcell 24 and the middle subcell 20, and/or a second plurality of subcells (not shown) can be grown between the middle subcell 20 and the bottom subcell 28.

Figure 3:
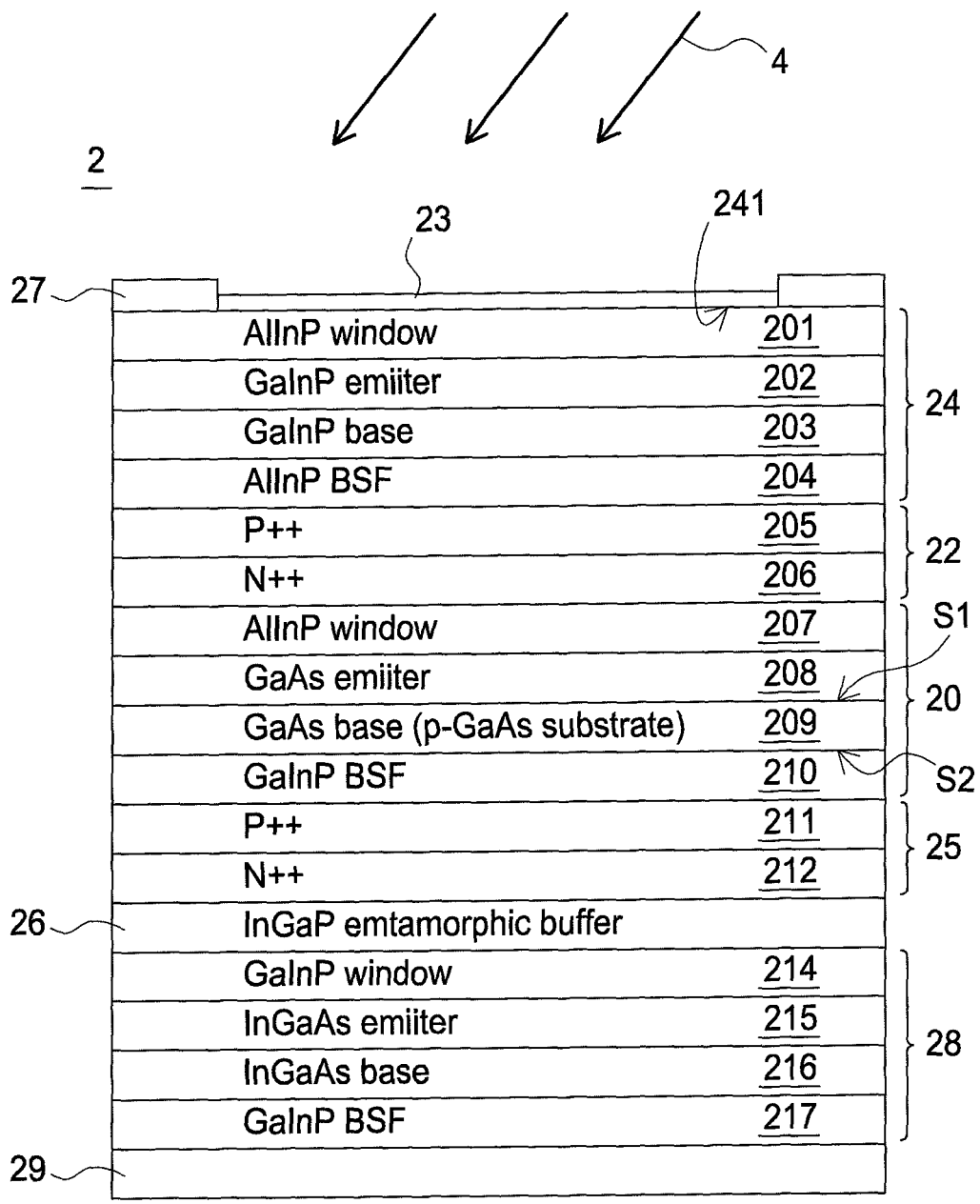
FIG. 3 illustrates a photovoltaic cell structure in accordance with an embodiment of the present application.

FIG. 3 illustrates an embodiment of the present application, the photovoltaic cell 2 can be a multi-junction cell which comprises three subcells including a top subcell 24, a bottom subcell 28, and a middle subcell 20 provided between the top subcell 24 and the bottom subcell 28. The middle subcell 20 comprises a substrate 209 having a first side S1 and a second side S2. The top subcell 24 and the bottom subcell 28 are respectively formed on the first side S1 and the second side S2 of the substrate 209. The top subcell 24 comprises a window layer 201, an emitter layer 202 having a first type doping, a base layer 203 having a second type doping, and a BSF (back surface field) layer 204. For example, the first type doping is n-type doping, and the second type doping is p-type doping. The window layer 201 receives a light 4 such as the solar light, and transmits it to the emitter layer 202 and then to the base layer 203. The window layer 201 also serves as a passivation layer to reduce the carrier recombination. The reduction in carrier recombination increases the conversion efficiency of the photovoltaic cell 2. A p-n junction (not shown) is formed between the emitter layer 202 and the base layer 203. Across the p-n junction, a voltage difference can be formed. The BSF layer 204 serves as a passivation layer like the window layer 201 described above. In accordance with an embodiment, the thickness of the window layer 201 is between 100 A and 500 A, preferably between 200 A and 300 A. The material of the window layer 201 comprises III-V semiconductor material such as AlInP. The total thickness of the emitter layer 202 and the base layer 203 is between 500 A and 1500 A, preferably between 800 A and 1200 A. The material of the emitter layer 202 and the base layer 203 comprises III-V semiconductor material such as GaInP. The thickness of the BSF layer 204 is between 500 A and 1500 A, preferably between 800 A and 1200 A. The material of the BSF layer 204 comprises III-V semiconductor material such as AlInP.

The bottom subcell 28 comprises a structure approximately similar to that of the top subcell 24. But the top subcell 24 and the bottom subcell 28 comprise different III-V semiconductor material, and that makes the band gaps of the top subcell 24 and the bottom subcell 28 different. The band gap of the bottom subcell 28 is smaller than that of the top subcell 24. In accordance with an embodiment of the present application, the bottom subcell 28 comprises a window layer 214 made of GaInP, an emitter layer 215 made of InGaAs, a base layer 216 made of InGaAs and a BSF layer 217 made of GaInP.

The middle subcell 20 comprises a structure approximately similar to that of the top subcell 24 or the bottom subcell 28. The substrate 209 of the middle subcell 20 is provided to be a base layer of the photovoltaic cell 2. In accordance with an embodiment of the present application, the substrate 209 can be GaAs substrate, and the polarity of the GaAs substrate is preferably p-type. Other layers such as the window layer 207 made of AlInP, the emitter layer 208 made of GaAs and the BSF layer 210 made of GaInP are formed on the substrate 209. Because the III-V semiconductor material of the middle subcell 20 is different with those of the top subcell 24 and the bottom subcell 28, and that also makes the band gap of the middle subcell 20 being different with those of the top subcell 24 and the bottom subcell 28. The band gap of middle subcell 20 is larger than that of the bottom subcell 28, and is smaller than that of the top subcell 24.

In accordance with an embodiment of the present application, the material of the bottom subcell 28 is lattice mismatched with that of the middle subcell 20, and the difference of the lattice constant between the middle subcell 20 such as the GaAs-based subcell, and the bottom subcell 28 such as the InGaAs-based subcell, is larger than 0.5%. A metamorphic layer comprising III-V semiconductor material is preferably formed between the GaAs-based subcell and the InGaAs-based subcell to reduce the epitaxial defect caused by the lattice mismatch.

A tunnel junction 22 and 25 having $p^{++}/n^{++}$ doping and comprising III-V semiconductor material can be formed between the subcells 24, 20 and 28 for electrical connection. An anti-reflective layer 23 can be formed on the top surface 241 of the photovoltaic cell 2 to reduce the surface reflection. A top electrode 27 and a bottom electrode 29 can be respectively formed on the top subcell 24 and the bottom subcell 28 for conducting electricity generated by the photovoltaic cell 2 in response to the incident light 4.

In accordance with another embodiment of the present application, a first plurality of subcells (not shown) can be grown between the top subcell 24 and the middle subcell 20, and/or a second plurality of subcells (not shown) can be grown between the middle subcell 20 and the bottom subcell 28.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A manufacturing method of a photovoltaic cell, comprising:
    providing a substrate comprising GaAs and having a first side and a second side opposite to the first side;
    forming a middle subcell having a second band gap, a base layer having a first type doping, and an emitter layer having a second type doping different from the first type doping and comprising a same material as that of the base layer, wherein the substrate is provided to be the base layer of the middle subcell, and the emitter layer is directly formed on the substrate;
    growing a top subcell comprising InGaP-based material and having a first band gap from the first side of the substrate; and
    growing a bottom subcell comprising InGaAs-based material and having a third band gap from the second side of the substrate,
    wherein the first band gap is larger than the second band gap, the second band gap is larger than the third band gap, the thickness of the middle subcell is at least 100 μm and the thickness of the top subcell or the bottom subcell is smaller than 10 μm, and the top subcell growing step is prior to the bottom subcell growing step.

2. The manufacturing method according to claim 1, wherein the top subcell, the middle subcell and the bottom subcell comprise III-V semiconductor material.

3. The manufacturing method according to claim 1, wherein the difference of the lattice constant between the middle subcell and the bottom subcell is larger than 0.5%.

4. The manufacturing method according to claim 3, further comprising forming a metamorphic buffer layer comprising III-V semiconductor material between the bottom subcell and the middle subcell.

5. The manufacturing method according to claim 1, further comprising growing a first plurality of subcells between the top subcell and the middle subcell and/or a second plurality of subcells between the middle subcell and the bottom subcell.

6. The manufacturing method according to claim 1, wherein the first band gap of the top subcell is between 1.5 eV and 1.9 eV.

7. The manufacturing method according to claim 1, wherein the second band gap of the middle subcell is between 1.2 eV and 1.5 eV.

8. The manufacturing method according to claim 1, wherein the third band gap of the bottom subcell is between 0.5 eV and 1.2 eV.

9. The manufacturing method according to claim 1, wherein the polarity of the substrate is p-type.

10. The manufacturing method according to claim 1, further comprising forming a top electrode on the top subcell and a bottom electrode on the bottom subcell for conducting electricity generated by the photovoltaic cell in response to an incident light.

11. The manufacturing method according to claim 1, further comprising growing a plurality of tunnel junctions to electrically connect the top subcell, the middle subcell and the bottom subcell.

* * * * *